(12) United States Patent
Mochizuki

(10) Patent No.: US 9,118,133 B2
(45) Date of Patent: Aug. 25, 2015

(54) CONNECTION STRUCTURE OF ELECTRONIC COMPONENTS

(71) Applicant: Yazaki Corporation, Tokyo (JP)

(72) Inventor: Shinji Mochizuki, Makinohara (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 14/375,152

(22) PCT Filed: Feb. 28, 2013

(86) PCT No.: PCT/JP2013/056213
§ 371 (c)(1),
(2) Date: Jul. 29, 2014

(87) PCT Pub. No.: WO2013/133347
PCT Pub. Date: Sep. 12, 2013

(65) Prior Publication Data
US 2015/0004817 A1    Jan. 1, 2015

(30) Foreign Application Priority Data

Mar. 5, 2012   (JP) ................. 2012-048337

(51) Int. Cl.
*H01R 13/422*   (2006.01)
*H05K 7/12*   (2006.01)
(Continued)

(52) U.S. Cl.
CPC .......... *H01R 13/2457* (2013.01); *H01R 9/2441* (2013.01); *H01R 13/2492* (2013.01);
(Continued)

(58) Field of Classification Search
CPC ........... H01R 13/6608; H01R 13/2457; H01R 13/2492; H01R 25/145; H05K 7/12

USPC .............................. 439/620.21, 460
See application file for complete search history.

(56) References Cited

U.S. PATENT DOCUMENTS 4,018,981 A    4/1977 Hawkins
4,679,885 A    7/1987 Nestor et al.
(Continued)

FOREIGN PATENT DOCUMENTS

FR    2 422 267 A1    11/1979
JP    2007-149762 A    6/2007
WO    2008/073690 A1    6/2008

OTHER PUBLICATIONS

International Search Report, dated Oct. 16, 2013, issued by the International Searching Authority in counterpart International Application No. PCT/JP2013/056213.
Written Opinion, dated Oct. 16, 2013, issued by the International Searching Authority in counterpart International Application No. PCT/JP2013/056213.

*Primary Examiner* — James Harvey
*Assistant Examiner* — Matthew T Dzierzynski
(74) *Attorney, Agent, or Firm* — Sughrue Mion, PLLC

(57) ABSTRACT

Two bus bars 13 having terminal parts 19 at their one ends 17 are arranged in parallel. Right and left contact spring pieces 23a, 24a on an upper stage of the terminal parts 19 of the bus bars 13 are connected to a pair of contact parts of a semiconductor light emitting element 25 which is disposed between the two bus bars 13, and right and left contact spring pieces 23b, 24b on a lower stage of the terminal parts 19 of the bus bars 13 are connected to a pair of contact parts of a Zener diode 27 disposed between the two bus bars 13. The terminal parts 19 of the adjacent bus bars 13 are provided with first rotation restricting parts 48 which are adapted to be contacted with both side faces of the semiconductor light emitting element 25 which is disposed between the two bus bars.

2 Claims, 14 Drawing Sheets

(51) Int. Cl.
  *H01R 13/24* (2006.01)
  *H01R 9/24* (2006.01)
  *H01R 13/66* (2006.01)
  *H01R 13/717* (2006.01)
  *H01R 27/00* (2006.01)

(52) U.S. Cl.
  CPC .......... *H01R13/422* (2013.01); *H01R 13/6608* (2013.01); *H01R 13/7175* (2013.01); *H05K 7/12* (2013.01); *H01R 27/00* (2013.01)

(56) References Cited

U.S. PATENT DOCUMENTS

| | | | |
|---|---|---|---|
| 7,722,404 B2 * | 5/2010 | Neumetzler | 439/636 |
| 7,800,881 B2 * | 9/2010 | Benedetto | 361/117 |
| 2007/0127216 A1 | 6/2007 | Kamiya et al. | |
| 2008/0137377 A1 | 6/2008 | Brengartner et al. | |
| 2008/0305684 A1 | 12/2008 | Neumetzler et al. | |
| 2011/0092099 A1 | 4/2011 | Neumetzler et al. | |

* cited by examiner

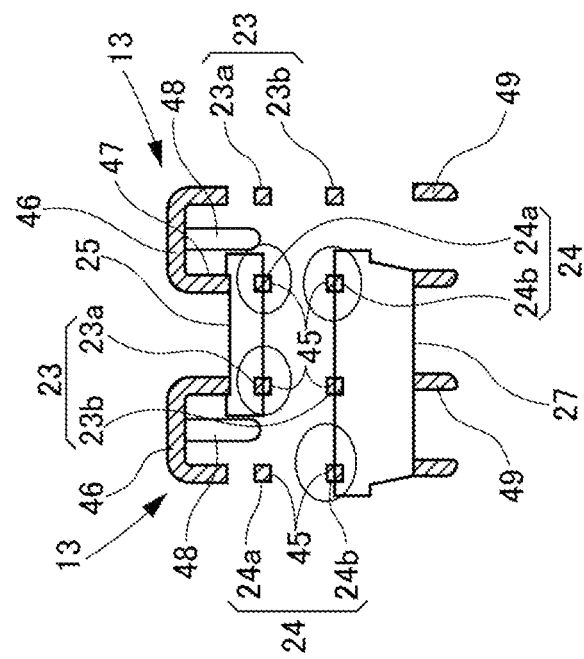
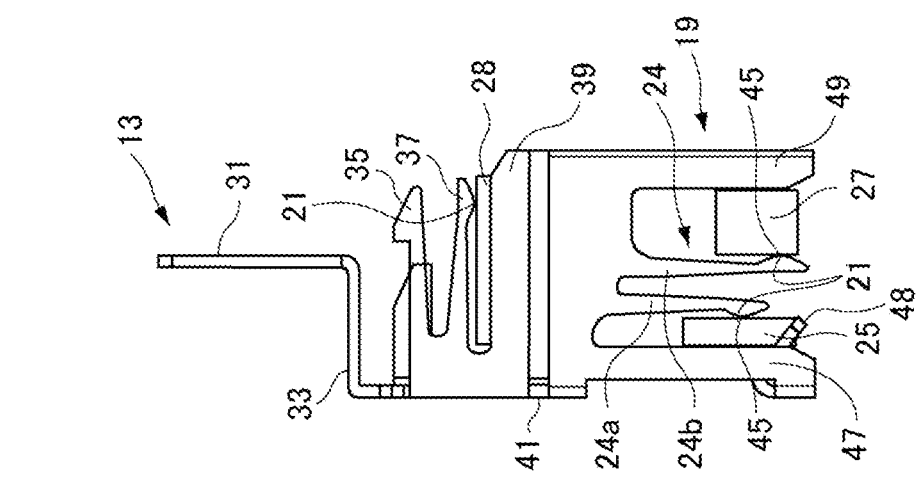
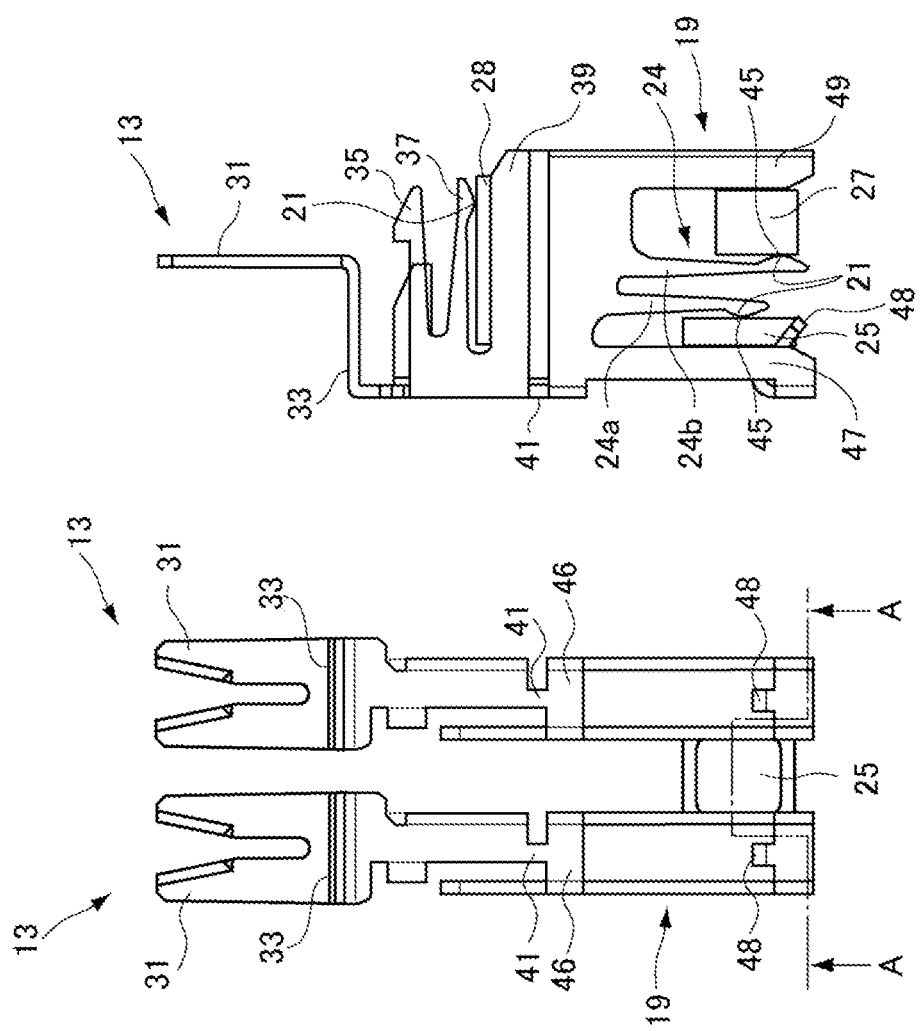

CONNECTION STRUCTURE OF ELECTRONIC COMPONENTS

TECHNICAL FIELD

The present invention relates to a connection structure of electronic components capable of establishing electrical connection of the electronic components having different pitches between contacts.

BACKGROUND ART

A connection structure of electronic components which obtains high reliability, by reliably establishing electrical connection of the electronic components is disclosed in Patent Literature 1. As shown in FIG. 14, in this connection structure of the electronic components, a pair of bus bars 501, 503 are assembled to a housing, and a semiconductor light emitting element (LED) 505, which is a light source, is also assembled to the housing. The bus bars 501, 503 in a shape of a bifurcated flat plate have a wire connecting part 507, a Zener diode connecting part 509, a resistor connecting part 511, and an LED connecting part 513. In the resistor connecting part 511, pressure-contacting blades 515, 515 are respectively provided on the bus bars 501, 503 which are bifurcated. In the Zener diode connecting part 509, a single pressure-contacting blade 517 is provided on one of the bus bars 501, and a single pressure-contacting blade 519 is provided on the other bus bar 503.

A Zener diode 521 is connected to a pair of the bus bars 501, 503 in parallel therewith, at a downstream side of a resistor 527, in such a manner that one of lead parts 523 is electrically connected to the one bus bar 501, while the other lead part 525 is electrically connected to the other bus bar 503. When a large voltage is inputted to a circuit by static electricity in a direction where a normal electromotive force flows to the diode, the diode 521 protects the LED from breakdown by the large voltage. In a direction where a counter electromotive force flows to the diode, the diode 521 blocks electrical connection, and thus, protects the LED from the breakdown in the same manner.

CITATION LIST

Patent Literature

[PTL 1] Japanese Patent Publication No. JP-A-2007-149762

SUMMARY OF INVENTION

Technical Problem

However, in the conventional connection structure of the electronic components, two kinds of the bus bars 501, 503 which are provided with connection parts (the pressure-contacting blades 515, 515, 517, 519) having different sizes according to shapes and sizes of the electronic components are required. Moreover, it is possible to mount only the electronic components (the Zener diode 521, the resistor 527) having the lead parts for through holes, and there has been such a problem that it is impossible to connect the electronic components for surface mount which are recently in great demand, and hence, cost reduction is attained.

This invention has been made in view of the above described circumstances, and an object of the invention is to provide a connection structure of electronic components capable of connecting a plurality of types of the electronic components for surface mount which are different in pitch between contacts, outer shape, and size, by using a single type of bus bars.

Solution to Problem

The above described object is achieved by employing the following structures.

(1) A connection structure of electronic components having a plurality of bus bars separately arranged in parallel and respectively provided with terminal parts at their one ends, each of the terminal parts having at least two pairs of right and left contact spring pieces in parallel configured to elastically contacted with a pair of contact parts which are provided on one face of each of the electronic components, wherein at least any two pieces out of the right and left contact spring pieces of the bus bars which are arranged in parallel are connected to the pair of the contact parts of the electronic component which is disposed between the bus bars, and wherein each of the terminal parts of the adjacent bus bars is provided with a first rotation restricting part which is adapted to be contacted with one of side faces of the electronic component which is being inserted to be disposed at a fixed position between the bus bars, the side faces being perpendicular to the one face of the electronic component at both side ends of the one face.

According to the connection structure of the electronic components having the structure as described above in (1), a plurality of the bus bars having the terminal parts which are provided with at least two pairs of the right and left contact spring pieces are separately arranged in parallel, and at least any two pieces out of the right and left contact spring pieces of the plurality of the bus bars are connected to a pair of the contact parts of each of the electronic components which is disposed between the bus bars. Therefore, it is possible to connect a plurality of types of the electronic components which are different in pitch between contacts, outer shape, and size, to the terminal parts between the plurality of the bus bars which are arranged in parallel.

Further, when the electronic component is inserted between the bus bars, a pair of the first rotation restricting parts come into contact with the both side faces of the electronic component, and hence, the electronic component is normally inserted, even though the two right and left contact spring pieces are different in flexure and are slightly different in spring load. Moreover, because the first rotation restricting parts can be formed by cutting and erecting parts of the body parts of the bus bars into a tongue-like shape, production of the connection structure becomes easy.

(2) A connection structure of electronic components as described in the above (1), wherein the adjacent bus bars are provided with second rotation restricting parts which are adapted to be contacted with the both side faces of the electronic component which is disposed at the fixed position between the bus bars, at a more forward position than the first rotation restricting parts in the insertion direction of the electronic component.

According to the connection structure of the electronic components having the structure as described above in (2), just before the insertion of the electronic component is completed, the both side faces of the electronic component at a distal end in the inserting direction come into contact with the second rotation restricting parts. Therefore, four corners of the electronic component are guided by a pair of the first rotation restricting parts and a pair of the second restricting parts, and the electronic component can be more reliably inserted up to the normal fixed position. Moreover, in case where the first rotation restricting parts are so provided as to be contacted with the side faces of the electronic component which is disposed at the fixed position, the four corners of the electronic component are supported by the first rotation restricting parts and the second rotation restricting parts at the fixed position, and hence, positional displacement of the electronic component is unlikely to occur with a shock or so.

Advantageous Effects of Invention

According to the connection structure of the electronic components of the invention, it is possible to connect the electronic components for surface mount which are different in pitch between contacts, outer shape, and size, by using a single type of the bus bars. It is also possible to prevent a lateral slippage when inserting each of the electronic components, thereby enabling the electronic component to be inserted to the normal fixed position.

BRIEF DESCRIPTION OF DRAWINGS

FIG. 4A is a plan view of the bus bars as shown in FIG. 1, FIG. 4B is a side view of the same, and FIG. 4C is a sectional view as seen from a direction of arrow marks A-A in FIG. 4A, showing a state where electronic components are mounted.

DESCRIPTION OF EMBODIMENTS

Figure 1:
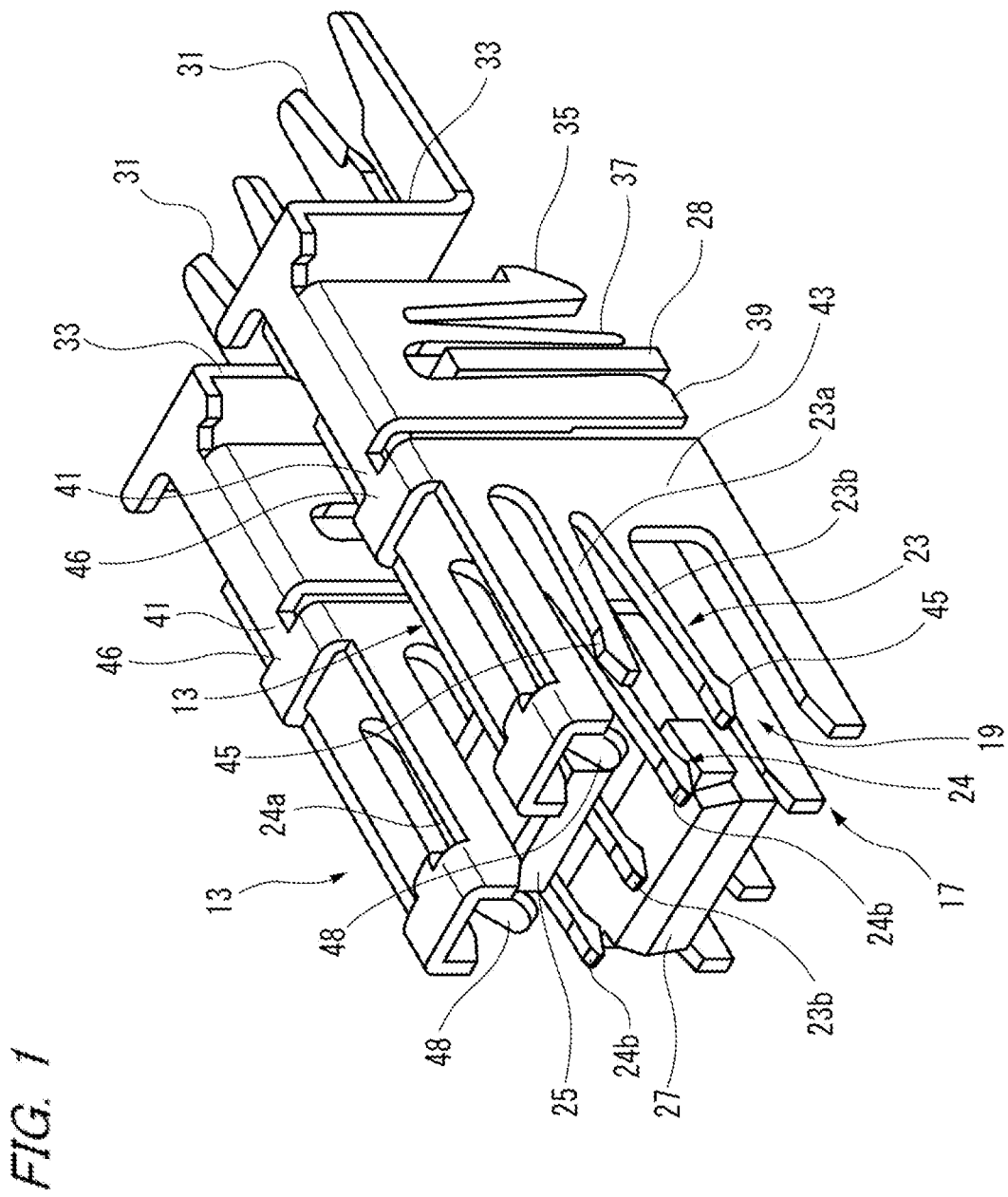
FIG. 1 is a perspective view of two bus bars which are used in a connection structure of electronic components according to a first embodiment of the invention.

Now, embodiments according to the invention will be described referring to the drawings.

Figure 2:
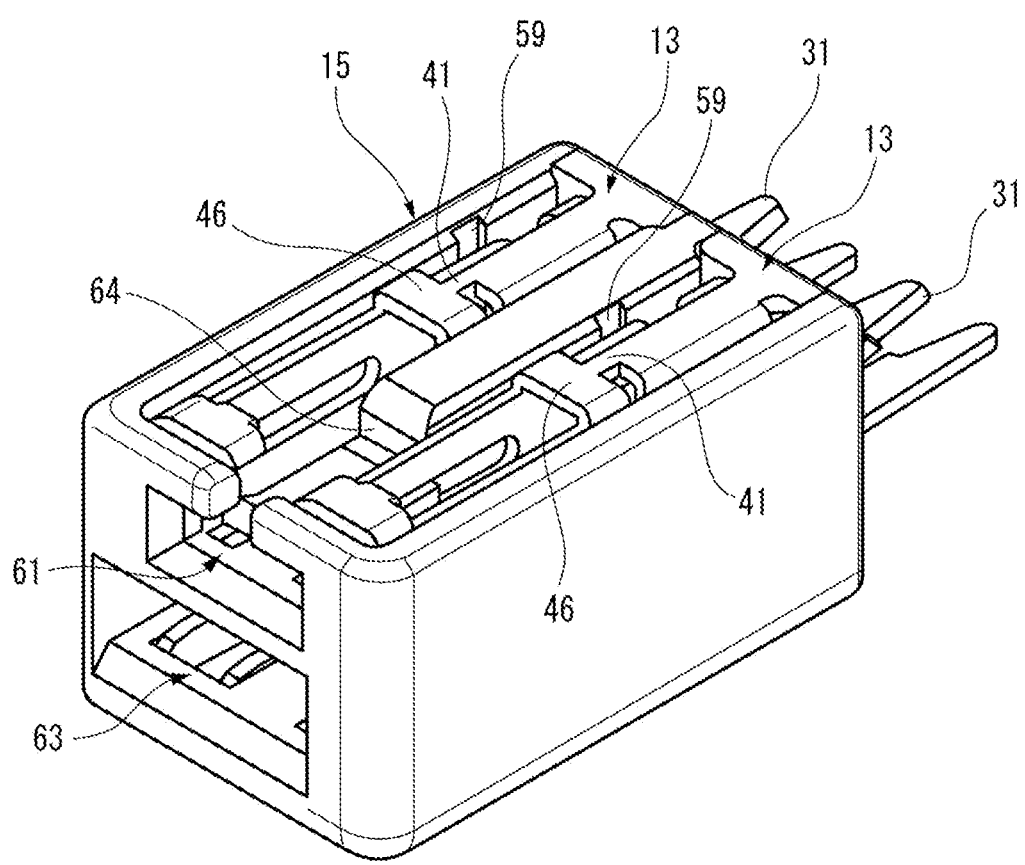
FIG. 2 is a perspective view of a housing in which the bus bars as shown in FIG. 1 are contained.

FIG. 1 is a perspective view of two bus bars which are used in a connection structure of the electronic components according to a first embodiment of the invention, and FIG. 2 is a perspective view of a housing in which the bus bars as shown in FIG. 1 are contained.

The connection structure of the electronic components according to this embodiment includes two bus bars 13 having a mutually same shape as shown in FIG. 1, as an essential part of the structure. These two bus bars 13 are used in a state contained in a housing 15 as shown in FIG. 2.

The two bus bars 13 according to this embodiment are respectively provided with terminal parts 19 at their one ends 17, and arranged in parallel leaving a space between them. The bus bars 13 in this embodiment are provided with the terminal parts 19 in two upper and lower stages, so that a plurality of types (two types in this embodiment) of electronic components, namely, a semiconductor light emitting element 25 and a Zener diode 27 can be connected. However, the connection structure of the electronic components according to the invention is not limited to this structure, but may be provided with the terminal parts 19 in one stage or in multiple stages of three or more.

In the terminal parts 19 in this embodiment, at least two pairs of right and left contact spring pieces 23a, 24a, 23b, 24b which can be elastically contacted with a pair of contact parts 21 provided on respective one faces of the semiconductor light emitting element 25 and the Zener diode 27 are formed in multiple stages vertically (two stages in this embodiment).

In this embodiment, each of the bus bars 13 has a pair of contact spring pieces 23, 24 which are bifurcated in a substantially Y-shape, and two pairs of the right and left contact spring pieces 23a, 24a, 23b, 24b are provided at distal ends of the contact spring pieces 23, 24. Electrical contact parts 45 of the two adjacent right and left contact spring pieces 24a, 23a out of the four right and left contact spring pieces 23a, 24a, 23a, 24a on the upper stage of the bus bars 13 which are arranged in parallel are brought into contact with the pair of the contact parts 21 of the semiconductor light emitting element 25 which is disposed between the two bus bars 13 (See FIGS. 4A to 4C). Meanwhile, electrical contact parts 45 of the two right and left contact spring pieces 24b, 24b striding one of the right and left contact spring pieces 23b out of the four right and left contact spring pieces 23b, 24b, 23b, 24b on the lower stage of the bus bars 13 which are arranged in parallel are brought into contact with the pair of the contact parts 21 of the Zener diode 27 which is located below the semiconductor light emitting element 25 between the two bus bars 13 (See FIGS. 4A to 4C).

Figure 3:
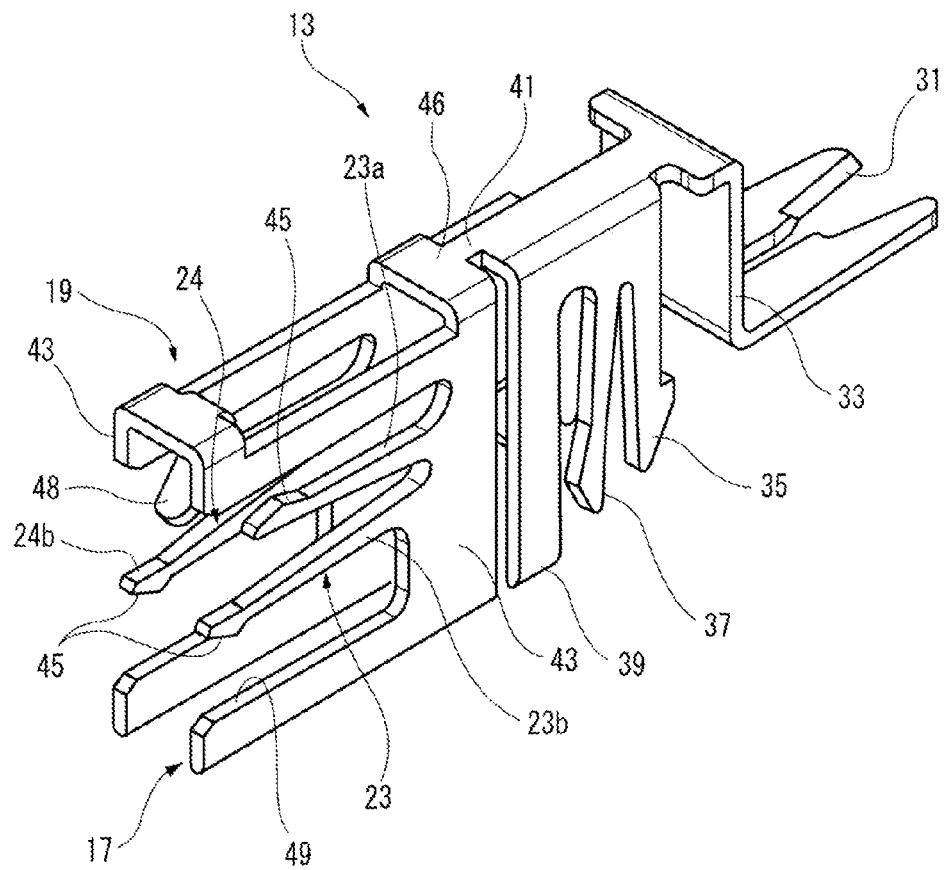
FIG. 3 is a perspective view of one of the bus bars as shown in FIG. 1.

FIG. 3 is a perspective view of one of the bus bars 13 as shown in FIG. 1.

In a state where the bus bar 13 is fitted to the housing 15, a part of the bus bar 13 is projected outward from the housing 15. In this embodiment, a projecting side of a part of the bus bar 13 is called as "a back side", and an opposite side is called as "a front side". A pressure-contacting blade 31 for cutting a covering of a covered electric wire for allowing electrical contact with a conductor is provided at a back end of the bus bar 13. In front of the pressure-contacting blade 31, a back butting piece 33, back elastic legs 35, front elastic legs 37, and front butting pieces 39 are continuously provided.

As shown in FIG. 3, a connection part 41 is formed between a pair of the front butting pieces 39 and the terminal part 19 of the bus bar 13. This connection part 41 can be cut, after the bus bar 13 has been contained in the housing 15. The pressure-contacting blade 31, the back butting piece 33, the back elastic legs 35, the front elastic legs 37, the front butting pieces 39, and the terminal part 19 are formed by being folded into such a shape as shown in FIG. 3, after they are integrally stamped out by a sheeting work. In order to form the terminal part 19 of the bus bar 13, a pair of side walls 43 are folded in a U-shape so as to be in parallel, and then, the contact spring pieces 23, 24 are formed on the respective side walls 43 by stamping. In order to form the bus bar 13, a bus bar body part 46 is formed by being folded in a U-shape. The contact spring pieces 23, 24 which are bifurcated in a substantially Y-shape are formed on a pair of the side walls 43 opposed to each other by stamping work, and two pairs of the right and left contact spring pieces 23a, 24a, 23b, 24b are formed at the distal ends of the contact spring pieces 23, 24. In this manner, it is possible to easily and compactly produce an elastic contact structure having a number of the electrical contact parts 45.

The bus bar 13 in such a posture as shown in FIG. 3 having the U-shaped open side directed below, a part of the bus bar body part 46 at an upper side is cut away in a rectangular shape. At a front side of this cut away part, there is provided a first rotation restricting part 48. Specifically, the first rotation restricting part 48 is formed by cutting and erecting a part of the bus bar body part 46 which constitutes the terminal part 19 so as to hang downward (provided in a hanging manner). In the connection structure of the electronic components according to this embodiment, the two bus bars having the same shape are arranged in parallel, as shown in FIG. 1. Accordingly, a pair of the first rotation restricting parts 48 are arranged in parallel leaving a space between them. The pair of the first rotation restricting parts 48 are adapted to be respectively contacted with both side faces 26 (See FIG. 5A) of the semiconductor light emitting element 25, while the semiconductor light emitting element 25 is being inserted to be fixed in the housing 15. It is to be noted that the both side faces 26 of the semiconductor light emitting element 25 are perpendicular to one face of the semiconductor light emitting element 25 which is provided with the pair of the contact parts 21, at both side ends of the one face.

Figure 5A:
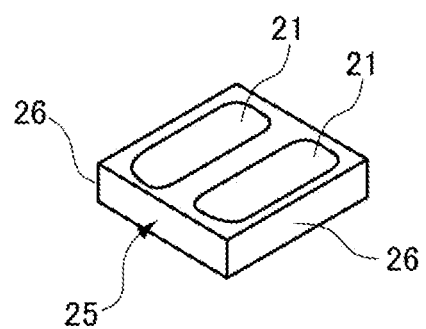
FIG. 5A is a perspective view of a semiconductor light emitting element.
Figure 5B:
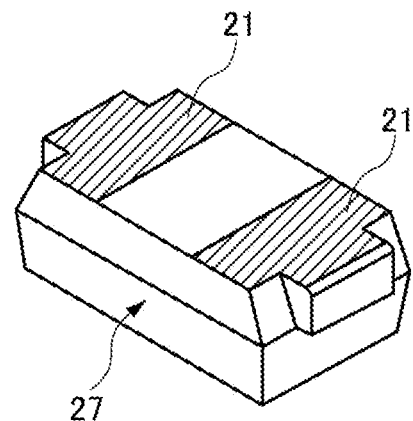
FIG. 5B is a perspective view of a Zener diode.

FIG. 4A is a plan view of the bus bars 13 as shown in FIG. 1, FIG. 4B is a side view of the same, and FIG. 4C is a sectional view as seen from a direction of arrow marks A-A in FIG. 4A, showing a state where the electronic components are mounted. FIG. 5A is a perspective view of the semiconductor light emitting element 25, and FIG. 5B is a perspective view of the Zener diode 27.

In each of the bus bars 13, a pair of the contact spring pieces 23, 24 are formed in parallel, and provided with two pairs of the right and left contact spring pieces 23a, 24a, 23b, 24b on the respective distal ends of the contact spring pieces 23 and 24 which are bifurcated in a substantially Y-shape. The electrical contact parts 45 projected from respective distal ends of the right and left contact spring pieces 23a, 24a, 23b, 24b are formed in a triangular shape of which a vertical angle functions as a contact. As shown in FIG. 4A, the two bus bars 13 are arranged in parallel leaving a space between them. Accordingly, the electrical contact parts 45 at the distal ends of the right and left contact spring pieces 23a, 24a, 23b, 24b are disposed at eight positions, specifically, at four positions per one side, as shown in FIG. 4C. Upper component seats 47 which are formed in the respective bus bars 13 are opposed to the electrical contact parts 45 at the upper four positions of the four right and left contact spring pieces 23a, 24a, 23a, 24a on the upper stage of the bus bars 13 which are arranged in parallel. Meanwhile, lower component seats 49 which are formed in the respective bus bars 13 are opposed to the electrical contact parts 45 at the lower four positions of the four right and left contact spring pieces 23b, 24b, 23b, 24b on the lower stage of the bus bars 13 which are arranged in parallel.

The semiconductor light emitting element 25 is mounted between the upper component seats 47 and the electrical contact parts 45 at the upper four positions of the four right and left contact spring pieces 23a, 24a, 23a, 24a on the upper stage. The Zener diode 27 is mounted between the lower component seats 49 and the electrical contact parts 45 at the lower four positions of the four right and left contact spring pieces 23b, 24b, 23b, 24b on the lower stage. The semiconductor light emitting element 25 is an electronic component for surface mount which is provided with the pair of the contact parts 21 on its one face, as shown in FIG. 5A. The Zener diode 27 is also an electronic component for surface mount which is provided with the pair of the contact parts 21 on its one face, as shown in FIG. 5B.

As shown in FIG. 4C, the face of the semiconductor light emitting element 25 provided with the contact parts 21 are opposed to the electrical contact parts 45 of the right and left contact spring pieces 23a, 24a on the upper stage, and its back face is butted against the upper component seats 47. The face of the Zener diode 27 provided with the contact parts 21 are opposed to the electrical contact parts 45 of the right and left contact spring pieces 23b, 24b on the lower stage, and its back face is butted against the lower component seats 49.

In this embodiment, a pitch between contacts of the semiconductor light emitting element 25 is smaller than a pitch between contacts of the Zener diode 27. In short, the two electronic components have different pitches between the contacts. In the connection structure of the electronic components in this embodiment, it is possible to mount two types of the electronic components, namely, the semiconductor light emitting element 25 and the Zener diode 27 having the different pitches between the contacts, at the same time. Specifically, as shown in FIG. 4C, the electrical contact parts 45 of the two adjacent right and left contact spring pieces 24a, 23a out of the four right and left contact spring pieces 23a, 24a, 23a, 24a on the upper stage of the bus bars 13 which are arranged in parallel come into contact with the pair of the contact parts 21 of the semiconductor light emitting element 25. Meanwhile, the electrical contact parts 45 of the two right and left contact spring pieces 24b, 24b striding one of the right and left contact spring pieces 23b out of the four right and left contact spring pieces 23b, 24b, 23b, 24b on the lower stage of the bus bars 13 which are arranged in parallel come into contact with the pair of the contact parts 21 of the Zener diode 27.

Specifically, the semiconductor light emitting element 25 is connected to the second and third electrical contact parts 45 from the left in FIG. 4C, out of the electrical contact parts 45 on the upper stage of the bus bars 13 which are arranged in parallel. Moreover, the Zener diode 27 is connected to the first and third electrical contact parts 45 from the left, out of the electrical contact parts 45 on the lower stage of the bus bars 13 which are arranged in parallel. However, it is also possible to connect the Zener diode 27 to the second and fourth electrical contact parts 45 from the left. Moreover, although the Zener diode 27 in which the pitch between the contacts is double of the pitch between the electrical contact parts 45 is used in this embodiment, it is also possible to use the Zener diode 27 in which the pitch between the contacts is triple of the pitch between the electrical contact parts 45. In this case, the pair of the contact parts 21 of the Zener diode 27 are connected to the first and fourth electrical contact parts 45 from the left.

Then, assembling steps of the connection structure of the electronic components having the above described structure will be described.

Figure 6:
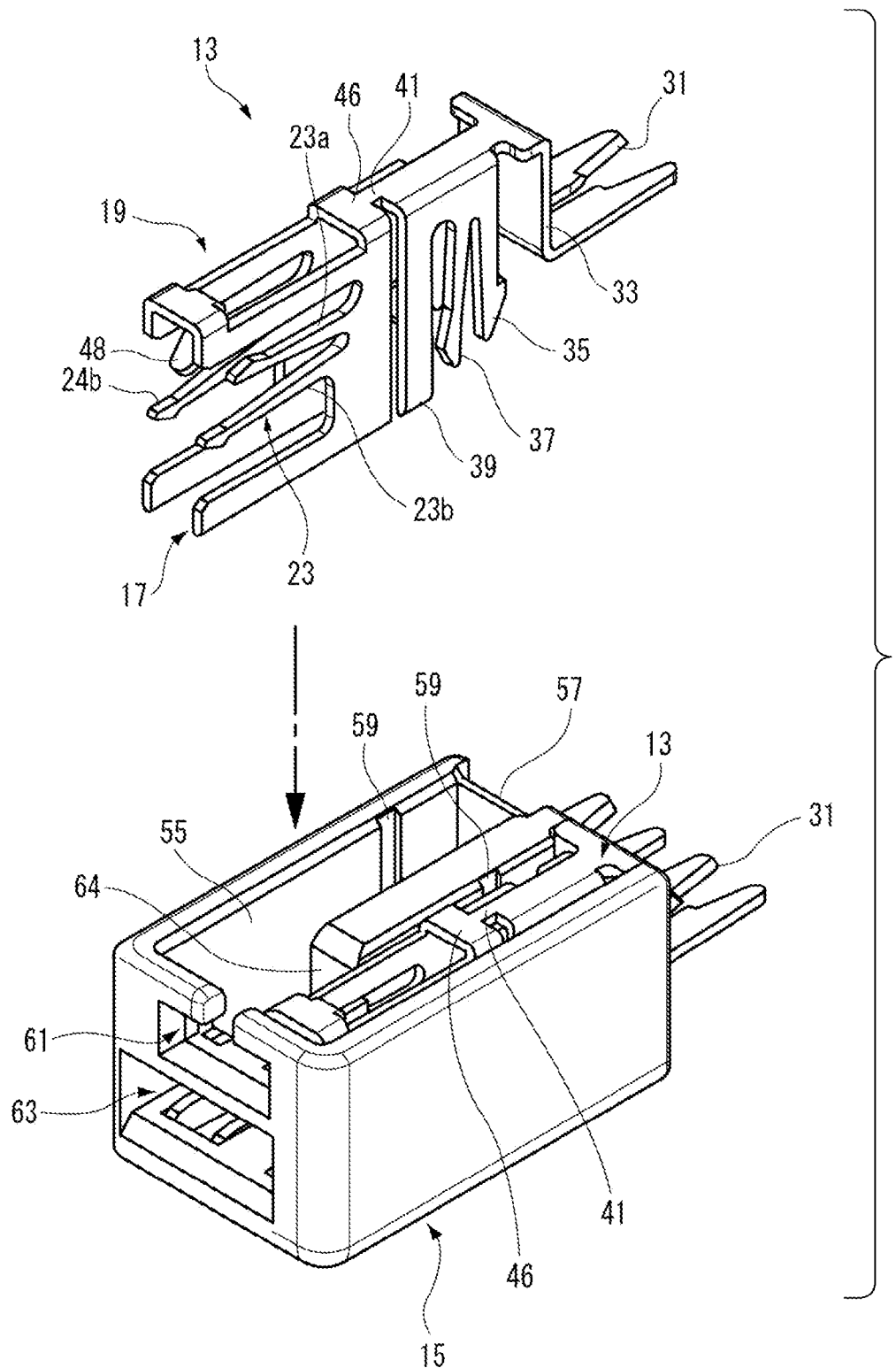
FIG. 6 is a view for explaining an assembling step of the bus bars in the connection structure of the electronic components according to the first embodiment of the invention.
Figure 7:
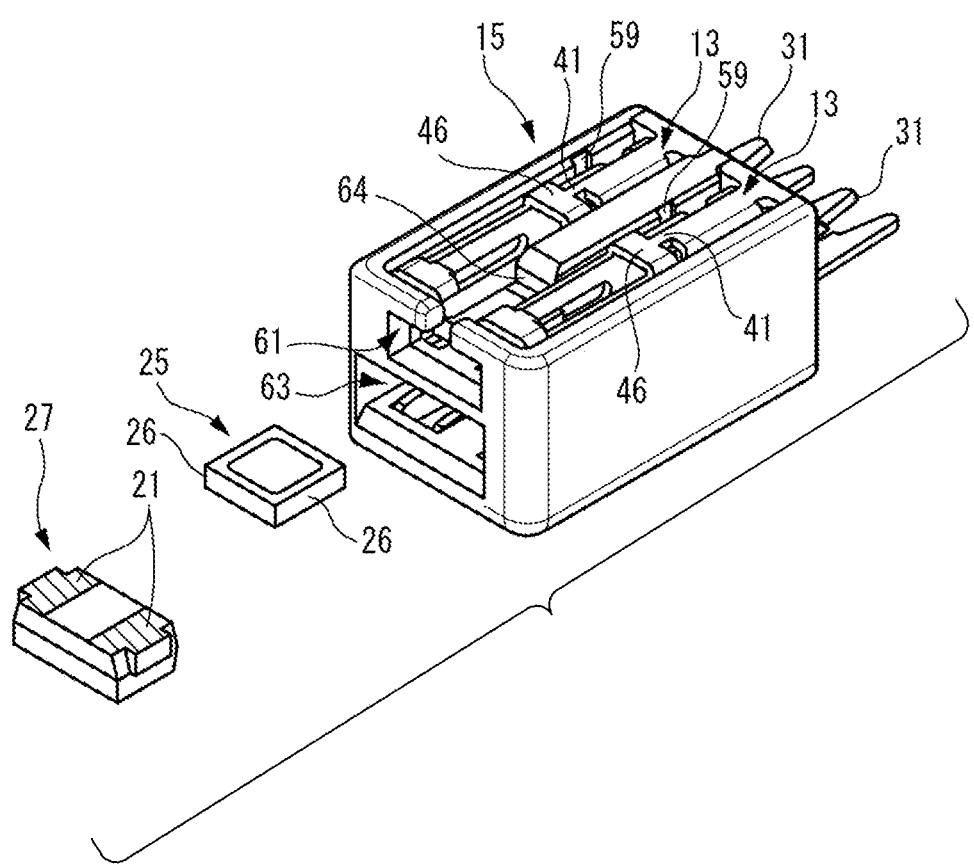
FIG. 7 is a view for explaining an assembling step of the electronic components.
Figure 8A:
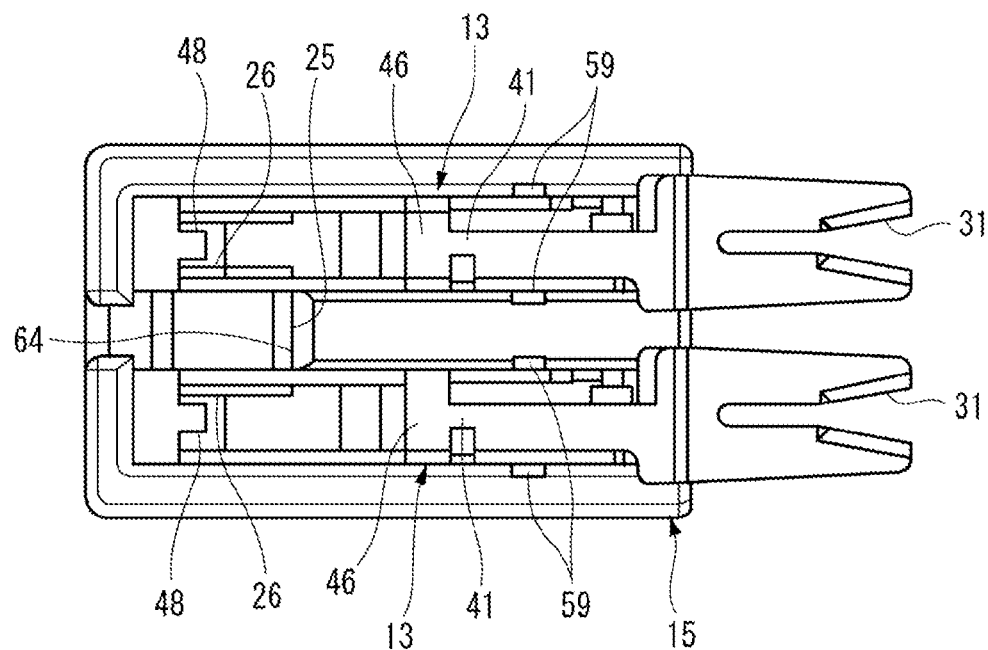
FIG. 8A is a plan view of the housing into which the bus bars have been inserted.
Figure 8B:
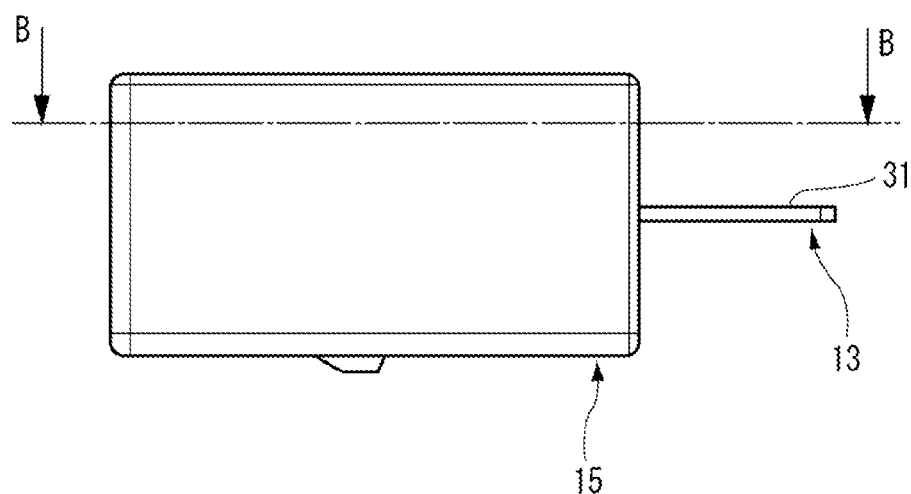
FIG. 8B is a side view of the same.
Figure 9A:
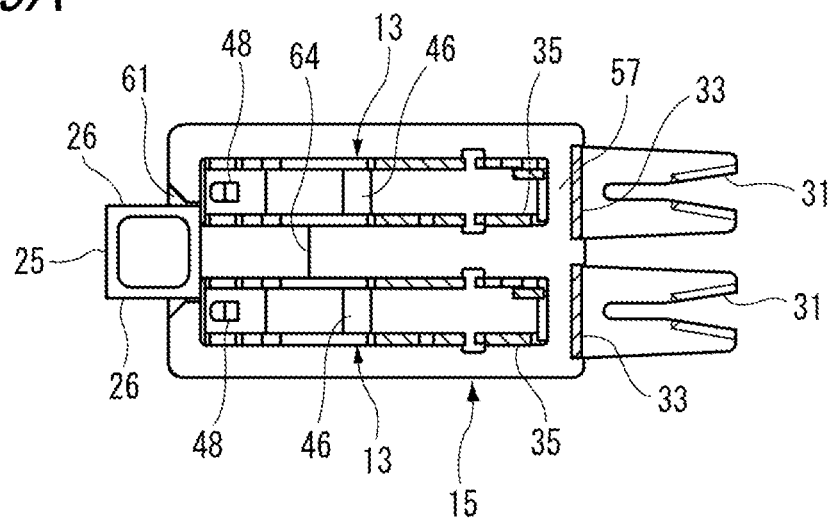
FIG. 9A is a sectional view of the housing taken along arrow marks B-B in FIG. 8B, just before the electronic component is inserted.
Figure 9B:
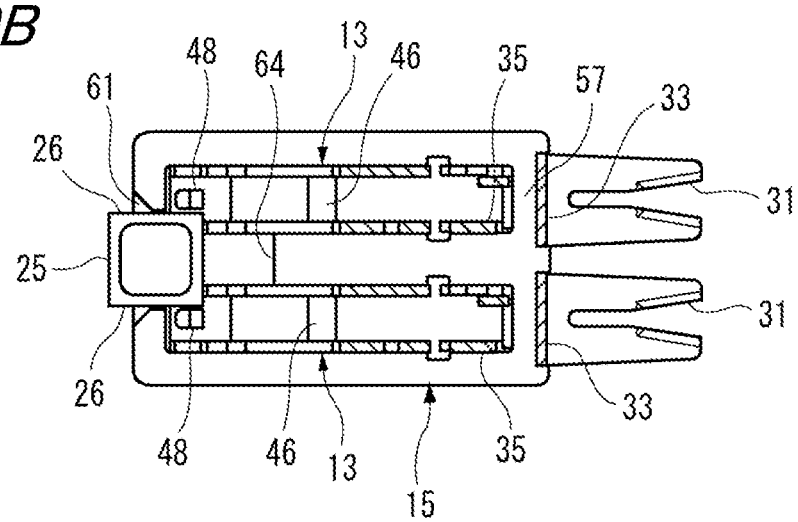
FIG. 9B is a sectional view of the same, while the electronic component is being inserted.
Figure 9C:
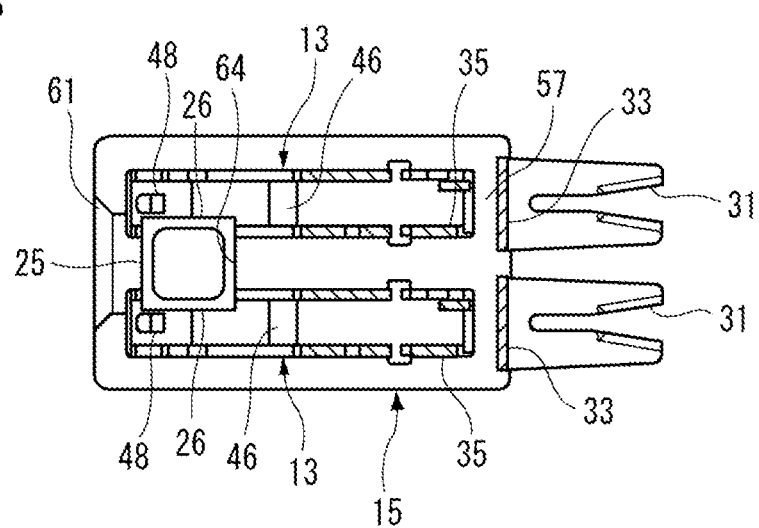
FIG. 9C is a sectional view of the same, after the electronic component has been completely inserted.
Figure 10:
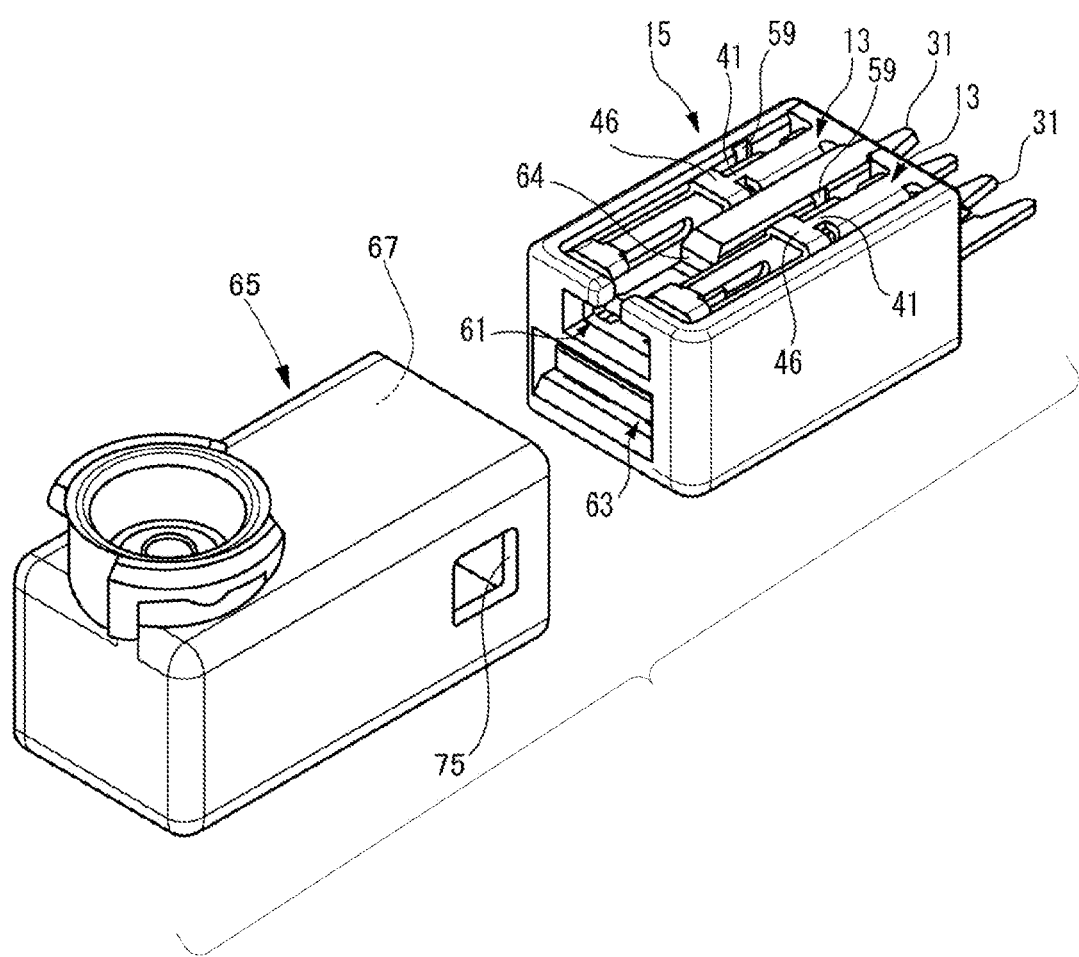
FIG. 10 is a view for explaining an assembling step of the housing.
Figure 11:
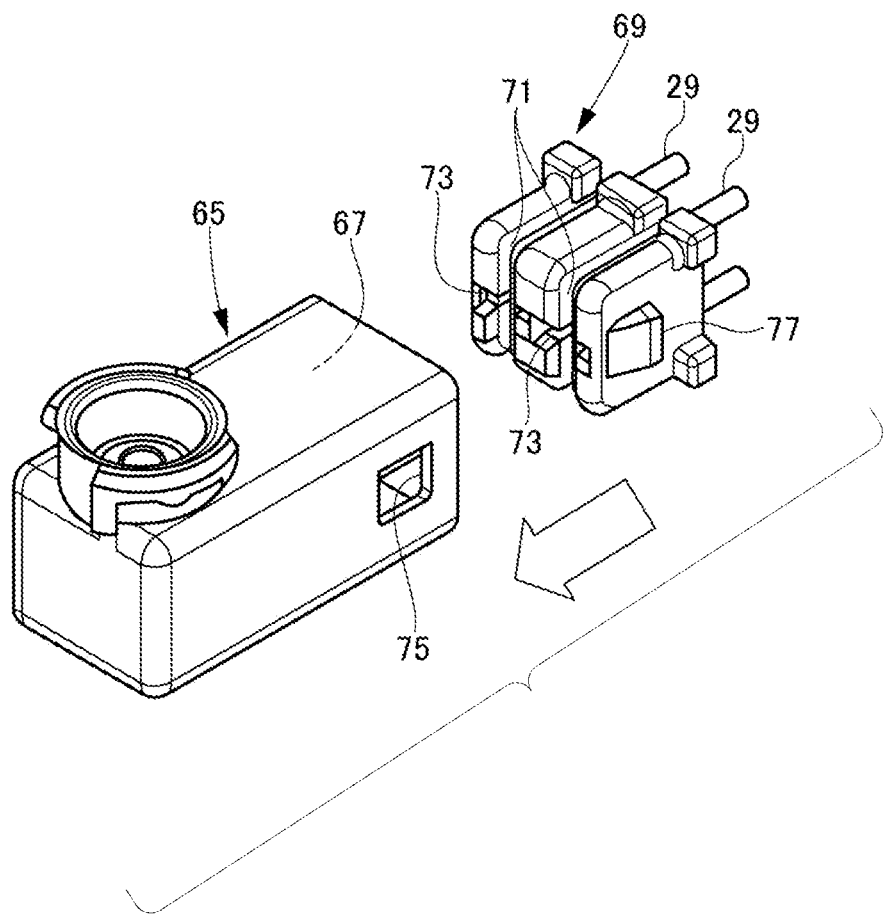
FIG. 11 is a view for explaining an assembling step of a wire holder.
Figure 12:
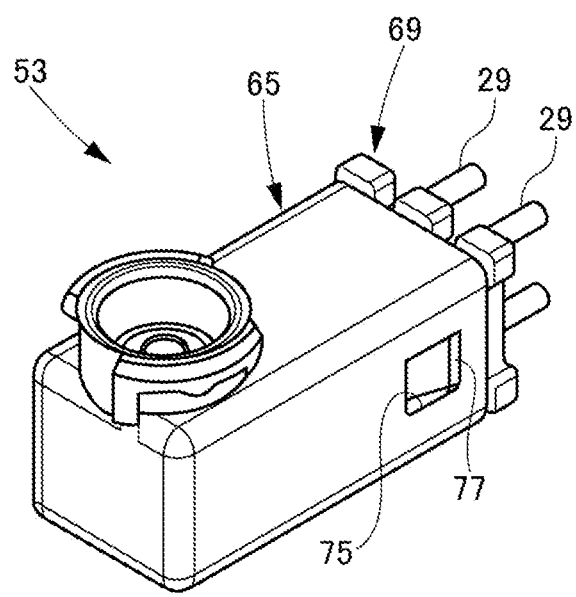
FIG. 12 is a perspective view of an LED unit employing the connection structure of the electronic components according to the first embodiment of the invention.

FIG. 6 is a view for explaining an assembling step of the bus bars in the connection structure of the electronic components according to the embodiment of the invention, and FIG. 7 is a view for explaining an assembling step of the electronic components in the same manner. FIG. 8A is a plan view of the housing 15 into which the bus bars 13 are inserted, and FIG. 8B is a side view of the same. FIG. 9A is a sectional view of the housing taken along arrow marks B-B in FIG. 8B, just before the electronic component is inserted, FIG. 9B is a sectional view of the same, while the electronic component is being inserted, and FIG. 9C is a sectional view of the same, after the electronic component has been completely inserted. FIG. 10 is a view for similarly explaining an assembling step of the housing, FIG. 11 is a view for similarly explaining an assembling step of a wire holder, and FIG. 12 is a perspective view of an LED unit 53 employing the connection structure of the electronic components according to the embodiment of the invention.

The above described connection structure of the electronic components can be favorably employed, for example, in the LED unit 53. In order to apply the connection structure of the electronic components to the LED unit 53, the two bus bars 13 are mounted to the housing 15, as shown in FIG. 6.

The housing 15 is provided with two bus bar containing rooms 55. Each of the bus bar containing rooms 55 has a back wall 57 at its back end, and a pair of holding grooves 59 which are formed on inner wall faces in front of the back wall 57. The bus bar 13 which is inserted into the bus bar containing room 55 is mounted so as not to fall from the housing 15, by clamping the back wall 57 between the back butting piece 33 and the back elastic legs 35.

As shown in FIG. 7, an LED mounting opening 61 and a diode mounting opening 63 are formed in two stages vertically on a front face of the housing 15. The semiconductor light emitting element 25 is inserted into the LED mounting opening 61 with the contact parts 21 directed downward, and the Zener diode 27 is inserted into the LED mounting opening 63 with the contact parts 21 directed upward. For example, the semiconductor light emitting element 25 is fixed, after it has been completely inserted up to a predetermined fixed position, as shown in FIG. 8A. In this manner, the respective contact parts 21 thereof are connected to the corresponding electrical contact parts 45, as shown in FIG. 4C. Moreover, the holding grooves 59 are opened on a bottom face of the housing 15, and resistors 28 (See FIG. 4B) are inserted into the holding grooves 59. In this manner, each of the resistors 28 is clamped between the front butting pieces 39 and the front elastic legs 37 of the bus bar 13 at a forehand side in the drawing, and electrical contact parts of the front elastic legs 37 are connected to a pair of contact parts of the resistor 28 (See FIG. 1).

It is necessary to construct the LED unit 53 according to the embodiment in such a manner that its circuit includes the semiconductor light emitting element 25, the Zener diode 27, and the resistors 28 respectively provided between positive terminals and negative terminals. For this purpose, as shown in FIG. 3, the connection part 41 is formed between a pair of the front butting pieces 39 and the terminal part 19 of the bus bar 13. This connection part 41 is cut, after the bus bar 13 has been contained in the housing 15 and the resistors 28 have been inserted into the holding grooves 59. Because the connection part 41 is cut, one of the contact parts of the resistor 28 in each of the bus bars 13 comes into contact with the pressure-contacting blade 31, and the other contact part of the resistor 28 comes into contact with the front elastic legs 37. In this manner, the circuit in which the resistor 28 is provided in series between the pressure-contacting blade 31 and the terminal part 19 is formed.

When the semiconductor light emitting element 25 is inserted into the housing 15, the semiconductor light emitting element 25 is first guided by the LED mounting opening 61 having a tapered inlet which is formed in the housing 15, as shown in FIG. 9A, and horizontally inserted into the housing 15 in a rotation restricting manner. Herein, the rotation means a rotation around an axis which is perpendicular to upper and lower faces of the semiconductor light emitting element 25.

As shown in FIG. 9B, in a state where about a half of the semiconductor light emitting element 25 is inserted into the LED mounting opening 61, front parts of the both side faces 26 are clamped between a pair of the first rotation restricting parts 48 to come into contact therewith. Specifically, when the semiconductor light emitting element 25 is inserted between the bus bars 13, a pair of the first rotation restricting parts 48 are contacted with the both side faces 26 of the semiconductor light emitting element 25. As the results, even in case where the two right and left contact spring pieces 23a, 24a are different in flexure and are slightly different in spring load, the semiconductor light emitting element 25 can be normally inserted in a rotation restricting manner. The semiconductor light emitting element 25 is restrained from insertion by a stopper face 64 which is formed in the housing 15, thereby to stop at the normal fixed position.

Moreover, the first rotation restricting part 48 can be provided in a hanging manner, by cutting and erecting a part of the bus bar body part 46 as a tongue-like piece. Therefore, the first rotation restricting part 48 can be formed utilizing a flat plate part of the bus bar body part 46. In case where the semiconductor light emitting element 25 has a large wall thickness, it is possible to clamp the both side faces 26 between stepped parts or the like which are formed by folding the bus bar body part 46 along an insertion direction. However, in case where the semiconductor light emitting element 25 has a small wall thickness, it is difficult to form the stepped parts. The first rotation restricting part 48 can be formed as the tongue-like piece which is cut and erected from the bus bar body part 46 having a shape of a flat plate. As a structure for restricting the both side faces 26, the tongue-like piece which is cut and erected is more advantageous than the stepped parts in respect of production. As the results, even in case where the electronic component has a small wall thickness, the production becomes easy.

Further, in case of the stepped parts which are formed by folding along the insertion direction, there exist guide faces of the stepped parts extending along the both side faces 26. In this case, the guide faces are in face contact with the both side faces 26, and hence, an insertion resistance of the semiconductor light emitting element 25 is increased. To the contrary, the first rotation restricting part 48 can be contacted with the side faces 26 at an end face of its wall thickness, because it is an erected tongue-like piece, and hence, an insertion load is less increased.

As shown in FIG. 10, the housing 15 equipped with the semiconductor light emitting element 25 and the Zener diode 27 is assembled to a lens cover 65. A housing insertion opening 67 is formed on a back end face of the lens cover 65. In a state where the housing 15 is inserted into the lens cover 65, the pressure-contacting blades 31 are protruded backward inside the lens cover 65.

As shown in FIG. 11, a wire holder 69 is inserted into the lens cover 65 to which the housing 15 has been assembled, through the housing insertion opening 67. The wire holder 69 is provided with wire holding grooves 71 in a C-shape at two positions on three outer faces thereof. Electric wires 29 with coverings are fitted into the respective wire holding grooves 71 in a state folded into a C-shape. Horizontal slits 73 for allowing intrusion of the pressure-contacting blades 31 are formed on a front face of the wire holder 69 so as to stride the wire holding grooves 71. According to this structure, when the wire holder 69 is inserted into the lens cover 65, the pressure-contacting blades 31 of the bus bars 13 which are protruded backward inside the lens cover 65 intrude into the slits 73, so that electrical connection can be established between the pressure-contacting blades 31 and conductors of the electric wires 29.

When the wire holder 69 has been inserted into the lens cover 65, locking hooks 77 which are projected from its side faces are locked to locking holes 75 which are formed on side faces of the lens cover 65, thereby restraining the housing 15 and the wire holder 69 itself from dropping from the lens cover 65. By assembling the housing 15 and the wire holder 69 to the lens cover 65, the LED unit 53 as shown in FIG. 12 is formed.

As described above, in the connection structure of the electronic components in this embodiment, the two bus bars 13 having the terminal parts 19 in which two pairs of the right and left contact spring pieces 23a, 24a, 23b, 24b in parallel are formed on the two upper and lower stages are arranged in parallel. Then, the electrical contact parts 45 of the two adjacent right and left contact spring pieces 24a, 23a out of the four right and left contact spring pieces 23a, 24a, 23a, 24a on the upper stage of the bus bars 13 which are arranged in parallel come into contact with the pair of the contact parts 21 of the semiconductor light emitting element 25 which is disposed between the two bus bars 13. Meanwhile, the electrical contact parts 45 of the two right and left contact spring pieces 24b, 24b striding one of the right and left contact spring pieces 23b out of the four right and left contact spring pieces 23b, 24b, 23b, 24b on the lower stage of the bus bars 13 which are arranged in parallel come into contact with the pair of the contact parts 21 of the Zener diode 27 which is positioned below the semiconductor light emitting element 25 between the two bus bars 13. In this manner, it is possible to connect the electronic components which are different in the pitch between contacts, outer shape, and size.

Moreover, the two bus bars 13 each having a pair of the contact spring pieces 23, 24 in which two pairs of the right and left contact spring pieces 23a, 24a, 23b, 24b are formed at the respective distal ends which are bifurcated substantially in Y-shape are separately arranged in parallel. Accordingly, the electrical contact parts 45 are disposed at the eight positions, specifically, at the four positions per one side. As the results, the semiconductor light emitting element 25 having a smaller size and a smaller pitch between contacts can be connected to the electrical contact parts 45 of the two adjacent right and left contact spring pieces 24a, 23a out of the four right and left contact spring pieces 23a, 24a, 23a, 24a on the upper stage of the two bus bars 13 which are arranged in parallel. Meanwhile, the Zener diode 27 having a larger size and a larger pitch between contacts can be connected to the electrical contact parts 45 of the two right and left contact spring pieces 24b, 24b striding one of the right and left contact spring pieces 23b out of the four right and left contact spring pieces 23b, 24b, 23b, 24b on the lower stage.

Then, a modification of the connection structure of the electronic components according to a second embodiment of the invention will be described.

Figure 13A:
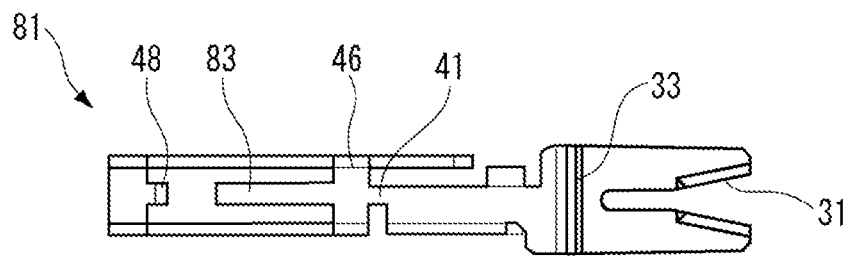
FIG. 13A is a plan view of a bus bar according to a second embodiment of the invention.
Figure 13B:
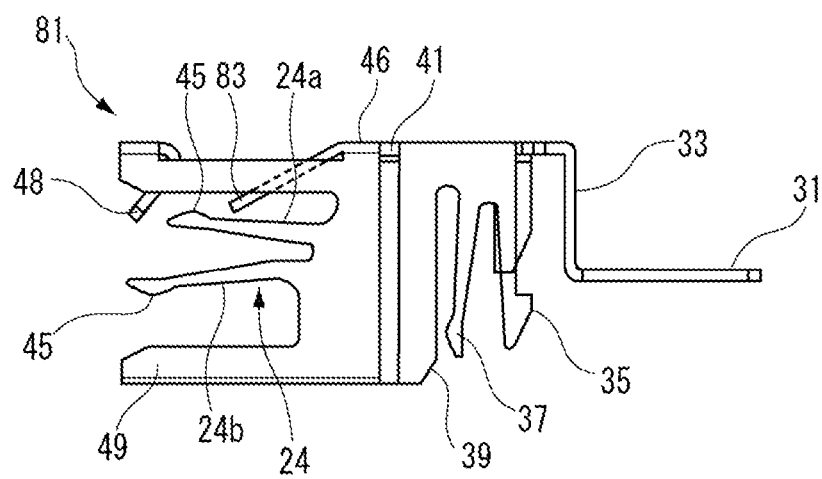
FIG. 13B is a side view of the same.
Figure 13C:
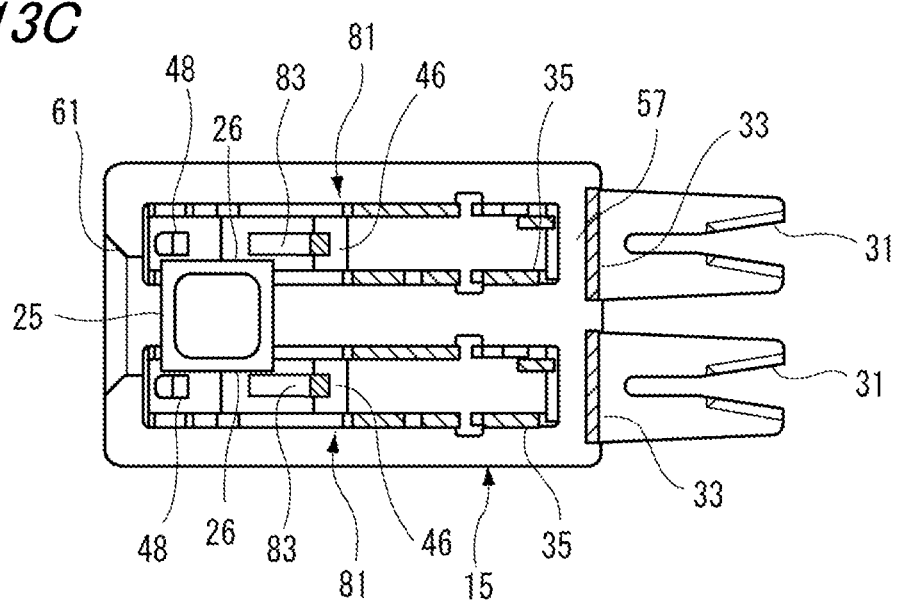
FIG. 13C is a horizontal sectional view of a housing which is cut away, and into which the bus bars according to the second embodiment of the invention are inserted.
Figure 14:
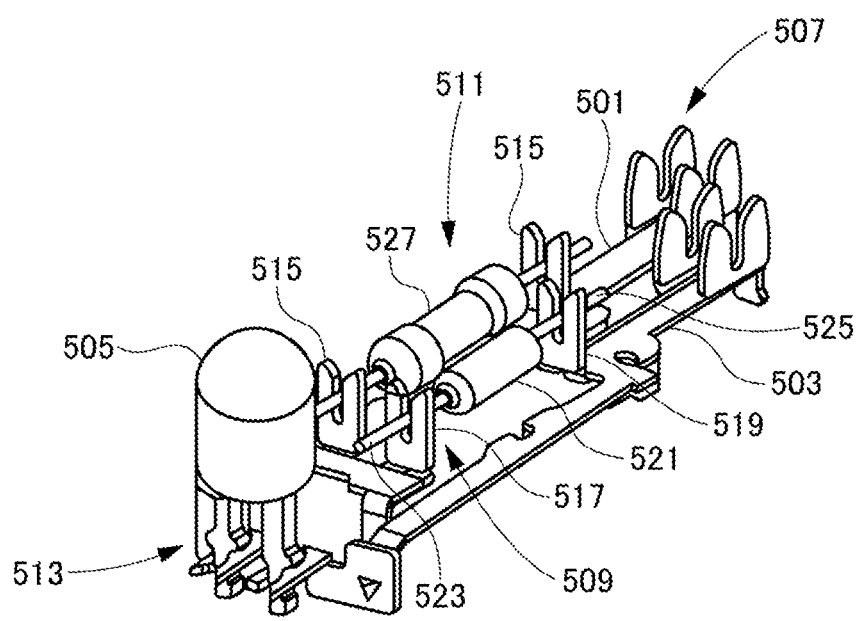
FIG. 14 is a perspective view of a conventional connection structure of electronic components.

FIG. 13A is a plan view of a bus bar 81 according to a second embodiment of the invention, FIG. 13B is a side view of the same, and FIG. 13C is a horizontal sectional view of a housing which is cut away, and into which the bus bars 81 according to the second embodiment of the invention are inserted.

In this second embodiment, the bus bar body parts 46 of the adjacent bus bars 81 are respectively provided with second rotation restricting parts 83 adapted to be contacted with the side faces 26 of the semiconductor light emitting element 25 which is disposed at the fixed position between the bus bars 81. The second rotation restricting parts 83 are provided more forward than the first rotation restricting parts 48 in the insertion direction of the semiconductor light emitting element 25. These second rotation restricting parts 83 can be formed by cutting and erecting parts of the bus bar body parts 46 which constitute the terminal parts 19, in the same manner as the first rotation restricting parts 48.

In the connection structure of the electronic components having a pair of the bus bars 81 provided in the housing 15, the both side faces 26 of the semiconductor light emitting element 25 at a distal end side in the insertion direction come into contact with the second rotation restricting parts 83, just before the insertion of the semiconductor light emitting element 25 is completed. As the results, the four corners of the semiconductor light emitting element 25 are guided by a pair of the first rotation restricting parts 48 and a pair of the second rotation restricting parts 83, as shown in FIG. 13C, thereby enabling the semiconductor light emitting element 25 to be more reliably inserted up to the normal fixed position. Moreover, the first rotation restricting parts 48 in this embodiment are so provided as to be contacted with the both side faces 26 of the semiconductor light emitting element 25 which is disposed at the fixed position. Accordingly, the four corners of the semiconductor light emitting element 25 are supported by the first and second rotation restricting parts 48, 83 in the fixed position, and therefore, positional displacement of the semiconductor light emitting element 25 is unlikely to occur even with a shock or so. It is to be noted that the first rotation restricting parts 48 according to the invention need not be provided so as to be necessarily contacted with the both side faces 26 of the semiconductor light emitting element 25, but it would be sufficient that the first rotation restricting parts 48 can guide the insertion of the semiconductor light emitting element 25 which is being inserted to be disposed at the fixed position, in a state contacted with the both side faces of the semiconductor light emitting element 25.

As described above, according to the connection structure of the electronic components of the invention, it is possible to connect a plurality of types of the electronic components for surface mount which are different in pitch between contacts, outer shape and size to connection circuits in various forms, using a single type of the bus bars. Additionally, on occasion of inserting the electronic components, it is possible to insert the electronic components up to the normal fixed position while preventing a lateral slippage.

The connection structure of the electronic components according to the above described embodiments has been heretofore described, referring to the connection structure of the electronic components which includes the two bus bars 13 having the same shape, as the essential part of the structure. However, the connection structure of the electronic components according to the invention is not limited to this. For example, the three or more bus bars having the same shape may be provided, as the essential part of the structure.

The connection structure of the electronic components according to the invention is not limited to the above described embodiments, but various modifications and improvements can be appropriately made. Further, materials, shapes, sizes, numbers, positions to be disposed of the constituent elements in the above described embodiments are optional, provided that the invention can be achieved, but not limited.

The present application is based on Japanese patent application No. 2012-048337 filed on Mar. 5, 2012, and the contents of the patent application are incorporated herein by reference.

INDUSTRIAL APPLICABILITY

The present invention is useful for providing a connection structure of the electronic components, which is possible to connect the electronic components for surface mount which are different in pitch between contacts, outer shape, and size, by using a single type of the bus bars, and also possible to prevent a lateral slippage when inserting each of the electronic components, thereby enabling the electronic component to be inserted to the normal fixed position.

REFERENCE SIGNS LIST 13, 81 Bus bar
17 One end
19 Terminal part
21 Contact part
23a, 24a Right and left contact spring piece
23b, 24b Right and left contact spring piece
25 Semiconductor light emitting element (electronic component)
26 Side face
27 Zener diode
46 Bus bar body part
48 First rotation restricting part
83 Second rotation restricting part

The invention claimed is:

1. A connection structure of electronic components having a plurality of bus bars separately arranged in parallel and respectively provided with terminal parts at their one ends, each of the terminal parts having at least two pairs of right and left contact spring pieces in parallel configured to elastically contacted with a pair of contact parts which are provided on one face of each of the electronic components, wherein at least any two pieces out of the right and left contact spring pieces of the bus bars which are arranged in parallel are connected to the pair of the contact parts of the electronic component which is disposed between the bus bars, and wherein each of the terminal parts of the adjacent bus bars is provided with a first rotation restricting part which is adapted to be contacted with one of side faces of the electronic component which is being inserted to be disposed at a fixed position between the bus bars, the side faces being perpendicular to the one face of the electronic component at both side ends of the one face.

2. A connection structure of electronic components as claimed in claim 1, wherein the adjacent bus bars are provided with second rotation restricting parts which are adapted to be contacted with the both side faces of the electronic component which is disposed at the fixed position between the bus bars, at a more forward position than the first rotation restricting parts in the insertion direction of the electronic component.

* * * * *